United States Patent [19]

Obinata et al.

[11] Patent Number: 4,675,243
[45] Date of Patent: Jun. 23, 1987

[54] CERAMIC PACKAGE FOR SEMICONDUCTOR DEVICES

[75] Inventors: Hiroaki Obinata; Kunihiko Imai; Masayuki Sunohara, all of Nagano, Japan

[73] Assignee: Shinko Electric Industries Co., Ltd., Nagano, Japan

[21] Appl. No.: 864,733

[22] Filed: May 12, 1986

Related U.S. Application Data

[63] Continuation of Ser. No. 582,633, Feb. 22, 1984, abandoned.

[30] Foreign Application Priority Data

Feb. 25, 1983 [JP] Japan .................. 58-31272

[51] Int. Cl.⁴ .................. B32B 15/04; C23F 7/00
[52] U.S. Cl. .................. 428/210; 428/472; 428/699; 428/901; 428/660; 428/665; 428/672
[58] Field of Search .............. 428/434, 472, 699, 701, 428/210, 901, 672, 660, 665

[56] References Cited

U.S. PATENT DOCUMENTS 3,079,676  3/1963  Myers .................. 428/672 X
3,350,180  10/1967  Croll .................. 428/672 X
3,460,968  8/1969  Bate et al. .................. 428/472 X
3,537,892  11/1970  Milkovich et al. .................. 428/434
4,050,956  9/1977  de Bruin et al. .................. 428/434 X
4,065,588  12/1977  Arnold .................. 428/672 X
4,153,753  5/1979  Woodman et al. .................. 428/472 X
4,282,043  8/1981  Chang .................. 428/672 X
4,465,742  8/1984  Nagashima et al. .................. 428/672 X

FOREIGN PATENT DOCUMENTS 605337  7/1948  United Kingdom .................. 428/472

Primary Examiner—Nancy A. Swisher
Attorney, Agent, or Firm—Staas & Halsey

[57] ABSTRACT

A ceramic package for semiconductor devices comprises a ceramic base, a gold-plated die-bonding area formed on the base for mounting thereon a semiconductor die, a gold-plated wire-bonding area, and a plurality of outerlead portions for electrically connecting the package to external printed circuits or the like. Cobalt or cobalt alloy, instead of nickel, is plated on the die-bonding and wire-bonding areas as underlayers of the gold-plated layers. Cobalt can also be plated on the outerlead portions, which may or may not have gold plated thereon.

17 Claims, 15 Drawing Figures

CERAMIC PACKAGE FOR SEMICONDUCTOR DEVICES

This is a continuation of co-pending application Ser. No. 582,633, filed on Feb. 22, 1984, now abandoned.

BACKGROUND OF THE INVENTION

1. Field of the Invention

The present invention relates to a ceramic package for accomodating semiconductor dies, and more particularly to such a ceramic package which may be heat-sealed with a ceramic cover by glass of relatively low melting point. The present invention can be advantageously applied to produce a highly reliable package having excellent characteristics, including high thermal conductivity, high density mounting, hermetic sealing, and so on.

2. Description of the Prior Art

A ceramic package may be made by forming conductive patterns of tungsten paste or the like on alumina layers, then laminating and baking the latter. Thereafter, outerleads may be brazed and surface treatment using a plating process may be carried out in order to give the required qualities of die and wire-bonding, hermetic sealing, soldering, and so on. A heretofore known surface finishing process for making a ceramic package includes, first, nickel plating on the metalized layers for improving brazing quality of the outerleads, second, electrolytic nickel plating of 2.0 $\mu$m to 3.0 $\mu$m after the brazing, the gold plating about 2.0 $\mu$m thick on the nickel. The compositions of metal to be plated and thicknesses thereof may be determined according to the heating process during assembly of the semiconductor packages. Consequently, the packages are subjected to a heating processes, such as die-bonding at 450° C. for five minutes; wire-bonding of 300° C. to 350° C. for five minutes; hermetic heat-sealing with metal lids at 350° C. for five minutes (where using Au/Sn eutectic alloy), or hermetic heat-sealing with ceramic covers at 480° C. for 12 minutes (where using glass of low melting point). In addition, in the case of highly integrated memories, after being assembled, semiconductor elements are subjected to an aging process of 150° C. for 24 hours. Therefore, it is required that the packages be sufficiently heatproof to preserve various functional qualities during the assembly processes.

In a conventional ceramic package plated with nickel 3.0 $\mu$m thick and gold 2.0 $\mu$m thick, heat tests of 450° C. for five minutes, sometimes show the fact that nickel diffuses onto the gold surface and forms an oxide. One of the reasons is that the metalized surface of the underlayer of nickel is so rough. Therefore, expensive gold must sometimes be plated relatively thickly.

However, it is nowadays required that the thickness of the gold plated layer be thin and that gold be plated only on selective areas, i.e., bonding areas, such as the die and wire-bonding areas, preserve the functional qualities of the conventional art, in view of reducing cost. In the case of plating nickel and annealing at 750° C., ten minutes is generally necessary before gold is plated, otherwise there is a possibility that the dies will peel off. If the nickel cannot be annealed, the plated gold is poor in appearance and the grains thereof are so small, the underlayer of nickel is easily heat-diffused. Therefore, nickel and gold plated packages do not have completely sufficient thermal qualities with respect to the heating conditions during assembly. As a result the qualities depending on heat resistability, such as qualities of die-bonding, wire-bonding and soldering, are unstable. Particularly, a selective gold plated package wherein no gold is plated on the outerlead portions is heated 450° C. to 480° C. when a die is bonded and when a cover is heat-sealed by glass having a low melting point. On the nickel surfaces of the outerlead portions, obstinate oxide films will be formed, which cannot be easily removed by flux which may be used during a subsequent soldering process. Therefore, functionally superior packages cannot be obtained through a soldering process unless a special acid treatment is performed, because the characteristic of solder wetting is poor due to the oxide film.

SUMMARY OF THE INVENTION

Accordingly, a primary object of the present invention is to provide a ceramic package for semiconductor devices capable of alleviating the above-mentioned difficulties in the prior art.

Another object of the present invention is to provide a ceramic package for semiconductor devices which is improved in die and wire-bonding abilities and excellent in solderability.

Still another object of the present invention is to provide a ceramic package for semiconductor devices which has good durability and high productivity, and is capable of being produced with minimum production loss.

According to the present invention, there is provided a ceramic package for semiconductor devices comprising a ceramic base having electrically conducting portion or portions on which a cobalt layer or layers are plated, and gold plated layer or layers is formed on a part of or the entire surface of the cobalt plated layer or layers.

The improvement of this invention can be typically observed in a glass sealed ceramic package for semiconductor devices, wherein the package is heat-sealed with a glass having a low melting point. According to the present invention, cobalt is plated in place of nickel in the prior art. Cobalt is not easily diffused into the brazed Ag/Cu alloy or gold plated layer, and the oxide which will be formed under the conditions of high temperature at which a ceramic cover is heat-sealed can be easily removed by flux treatment during the soldering process. Therefore, plating a cobalt layer can be very effective for improving the characteristics of packages, such as die wetting and solder wetting, or make it possible to omit the annealing process.

DESCRIPTION OF THE PREFERRED EMBODIMENTS

Figure 1:
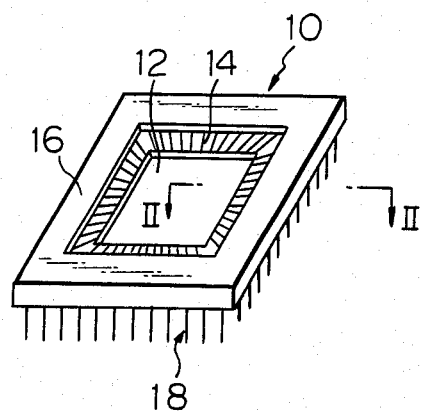
FIG. 1 is a perspective view of a pin grid array type ceramic package.
Figure 2:
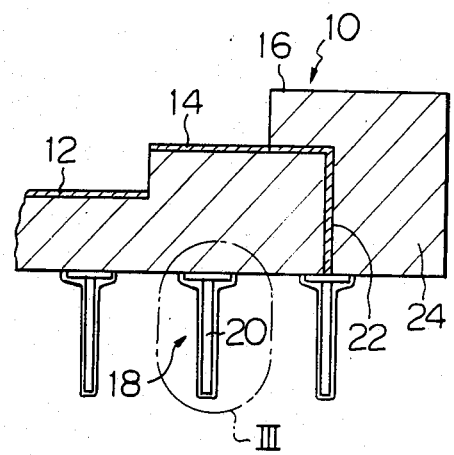
FIG. 2 is an enlarged cross-sectional view of the package taken along line II—II in FIG. 1.

Before describing the preferred embodiments of a ceramic package according to the present invention in detail, we will now briefly describe two general types of semiconductor packages, i.e., a pin grid array type and a chip carrier type ceramic package. Referring now to FIGS. 1 and 2, there is shown a pin grid array type package 10 for semiconductor devices, which is capable of being hermetically sealed with a ceramic cover (not shown) by using sealing glass having a low melting point. In this package 10, there is a die-bonding area 12 called a "stage" on which a semiconductor die (not shown) is mounted, a wire-bonding area 14, a sealing area 16, and a plurality of outerlead pins 20, which are arranged in grid like rows. These pins 20 are electrically connected to the respective terminals of the innerleads provided in the wirebonding area 14 through a plurality of metalized patterns 22 formed in a ceramic base 24.

Figure 4:
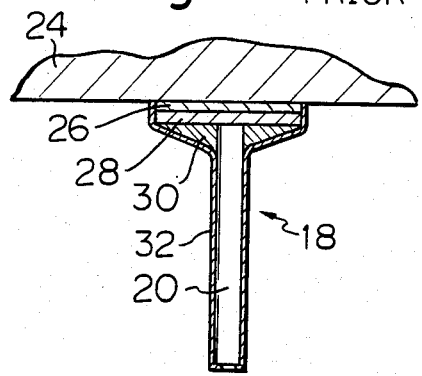
FIG. 4 is a cross-sectional view similar to FIG. 3, but showing an outerlead portion of a ceramic package known in the prior art.

In FIG. 4, there is shown in detail an outerlead portion 18 of a known pin grid array type ceramic package, which would be produced in accordance with a known technique. If the process of plating the outerlead portion with gold is omitted, a metalized layer 26, such as tungsten, is first formed on th ceramic base 24. Then, a nickel layer 28 is plated over the tungsten metalized layer 26. The lead pin 20 is then directly brazed on the nickel plated layer 28 by a Ag/Cu alloy 30. Another nickel layer 32 is then plated on the surfaces of the outerlead portions 18, die-bonding area 12 (FIG. 1 or 2), and innerleads 14. Then gold is selectively plated on portions, such as the die and wire-bonding areas 12 and 14, but is not plated on the outerlead portions 18. After wire-bonding is accomplished on the necessary portions, a ceramic cover (not shown) is heat-sealed on the sealing area 16 by sealing glass of low melting point, in an environment of relatively high temperature of 480° C. When the nickel plated layers 28 and 32 are exposed to such a high temperature of 480° C., obstinate solid oxide film will be formed, especially on the surface of the nickel plated layer 32. Therefore, when the outerlead portion 18 is soldered at a later stage with any solder, the latter will be dewetted so that the solder alloy cannot be advantageously coat the surface of the nickel plated layer 32.

In order to remove the above-mentioned obstinate oxide layer, a method has been proposed for dipping the package into a strong acid after the package is heat-sealed with a ceramic cover by sealing glass of low melting point. However, this method has a disadvantage in that the package, particularly the glass of low melting point of the sealing portion, may readily be subjected to erosion which may damage the durability, reliability and inspective appearance of the package.

Figure 5:
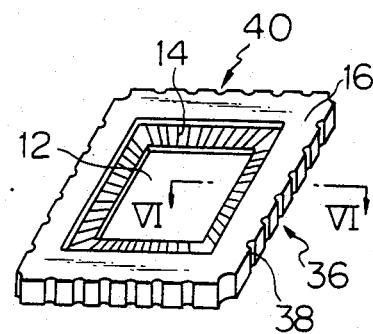
FIG. 5 is a perspective view of a chip carrier type ceramic package.
Figure 6:
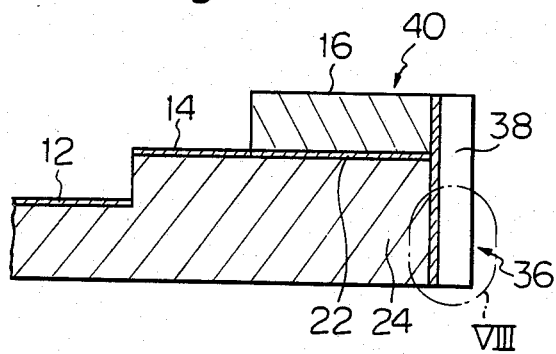
FIG. 6 is an enlarged cross-sectional view of the package taken along line VI—VI in FIG. 5.
Figure 7:
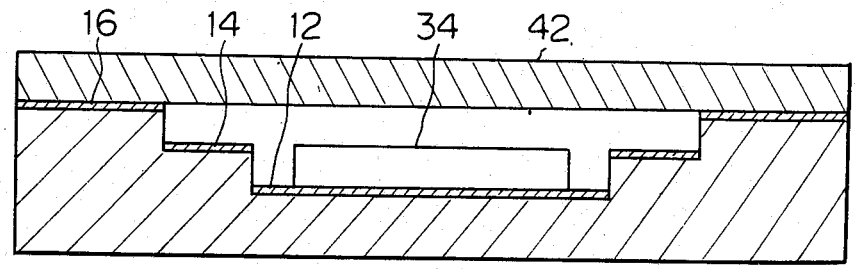
FIG. 7 is a cross-sectional view similar to FIG. 6, illustrating a semiconductor die mounted on the die-bonding area of the package.

Referring now to FIGS. 5 through 7, there is shown a leadless chip carrier type ceramic package 40 which is adapted to be heat-sealed with a ceramic cover 42 (FIG. 7) by sealing glass of low melting point. In this chip carrier type package, there is also a die-bonding area 12 on which a semiconductor die 34 (FIG. 7) is mounted, a wire-bonding area 14, a sealing area 16, and a outerlead portion 36. This chip carrier type package 40 is provided with a plurality of grooves 38 on its peripheral wall and metalized patterns 22 formed inside a ceramic base 24. These patterns 22 are connected to the grooves 38 to form a plurality of terminals in the grooves 38. Solder alloy may be attached to the grooves 38 to connect this package to a printed circuit substrate or the like.

In this kind of package, nickel is first plated on the exposed metalized layers, i.e., the die-bonding area 12, the innerleads 14, and the outerlead portions 36, and then gold is plated thereon. Then, the semiconductor die 34 is mounted on the die-bonding area 12, and wires are bonded (not shown). The ceramic cover 42 is then heat-sealed by sealing glass of low melting point, under a high temperature condition of 480° C.

This kind of chip carrier type package 40 is plated in the form of a wafer which contains many chip carriers without using a mask or the like, so that gold may be plated on the inner walls of the grooves, i.e., outerleads. However, since the throwing power of the plating material is poor in the narrow and deep grooves, it may result in a considerably thinner gold plated layer as compared to the gold plated layer of the diebonding area 12 on which the semiconductor die 34 is mounted. Therefore, under a high temperature condition of 480° C. at which the ceramic cover 42 is heat-sealed by sealing glass of low melting point, the plated nickel of the underlayer is diffused into the plated gold layer and through the gold layer onto the surface of the plated gold. Therefore, in the same manner as described before, an obstinate nickel oxide may be formed, which reduces the solderability because the outerlead portions cannot be sufficiently coated with gold plating.

Therefore, in a ceramic package, particularly of a type wherein a ceramic cover is heat-sealed by glass of low melting point and wherein, in order to reduce the production costs, gold is plated only on the die and wire-bonding areas on which a semiconductor die is mounted and wires are bonded, respectively, i.e., the outerlead portions have only a nickel layer, or of a chip carrier type wherein gold is plated all over the nickel plated area, but the thickness of plated gold is thin in outerlead portions, an obstinate oxide will be formed on the surface of the nickel plated layer or the nickel diffused onto the surface of the gold plated layer, due to the severe temperature condition while the die is bonded or the ceramic cover is heat-sealed. Such an oxide is difficult to remove and reduces the solderability because of the poor wetting characteristic of the oxide. Therefore, although such a ceramic package has a certain quality if the gold is thick, such a package has instability in its characteristics and costs increase with the thickness of the gold plating.

Figure 3:
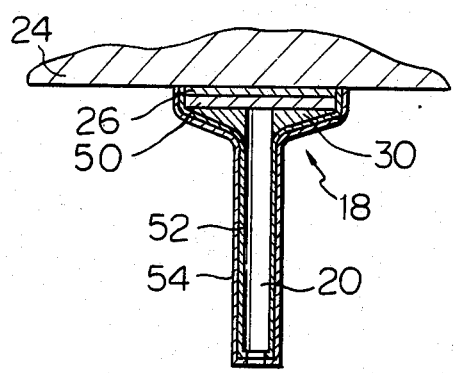
FIG. 3 is an enlarged cross-sectional view of a portion indicated by reference mark III in FIG. 2, showing an outerlead portion of the pin grid array type ceramic package according to the present invention.

In FIG. 3, there is shown an outerlead portion 18 of a pin grid array type ceramic package 10 (FIG. 1) having a cobalt layer 50 coated thereon for semiconductor devices of the present invention. According to the present invention, a ceramic base 24 is patterned with tungsten metalized layers 26 at the positions corresponding to outerlead portions 18 to be attached to the base 24. Then, a cobalt layer 50 is plated on the tungsten metalized layers 26, as well as on the die-bonding area 12 on which a semiconductor die (not shown in FIG. 3) is to be mounted, and on the wire-bonding area 14. The thickness of the cobalt plated layer 50 is not particularly limited, but a thickness of 0.5 to 3.0 μm may be suitable or sufficient.

Then, lead pins 20 are rigidly secured to the ceramic base 24 by means of Ag/Cu alloy 30. Cobalt layers 52 are further plated on the outerlead portions 18, the die-bonding area, and etc. to the thickness of 1 to 5 μm. Then, gold (not shown) is plated on the required portions, such as the die-bonding area 12 and innerleads 14 (FIG. 1), except for the outerlead portions 18. After that, a semiconductor die 34 (FIG. 7) is attached on the die-bonding area in an ordinary manner known in the art. After the wire-bonding operation is carried out, this package 10 is heat-sealed with a ceramic cover (FIG. 7) by glass of low melting point. At a later stage, the surfaces of the outerlead portions 18 are treated with flux, and after that, solder alloy 54 essentially consisting of tin and lead is coated by a dipping process in order that the package can be electrically connected to a printed circuit or the like. It will be appreciated that the characteristic of soldering in the outerlead portions 18 is satisfactory without oxide removal treatment.

Figure 8:
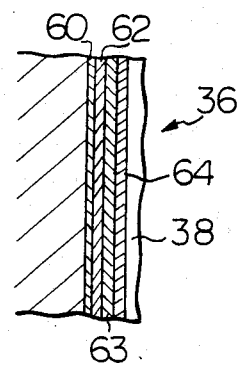
FIG. 8 is an enlarged cross-sectional view of a portion indicated by symbol VIII in FIG. 6, showing the outerlead portion of the chip carrier type ceramic package.

In FIG. 8, there is shown an outerlead portion 36 of a chip carrier type ceramic package 40 for mounting thereon a semiconductor die. In the same manner as in the above-described embodiment, a cobalt layer 62 is plated on the tungsten metalized layer 60, and then a gold layer 63 is plated thereon. Then, die-bonding, wire-bonding, and heat-sealing of a ceramic cover are carried out. After those, the outerlead portions 36 are treated with flux and solder alloy 64 essentially consisting of tin and lead in order that the package 40 (FIG. 5) can be electrically connected to a printed circuit or the like.

Now, some of the experimental results for wetting characteristics will be explained with reference to Tables 1 and 2 below and FIGS. 9 through 14. In the experiments, an acceleration test was carried out under the temperature conditions at which a ceramic package would be heat-sealed using a ceramic cover and glass of low melting point.

The "Embodiment" package tested was as follows:
20 pin chip carrier type ceramic package
   Under layer of cobalt plating: about 3.0 μm
   Gold plating: about 2.0 μm
   (In the 20 outerlead grooves of the package, gold was plated on the cobalt underlayer. However, the thickness (μm) of each plate layer is indicated as that at the outerlead portions for soldering.)

The above "Reference Example" package will be compared with the following prior art package:
20 pin chip carrier type ceramic package
   Under layer of nickel plating: about 3.0 μm
   Gold plating: about 2.0 μm
   (In the 20 outerlead grooves of the package, gold was plated on the nickel underlayer. However, the thickness of each plate layer is indicated as that at the outerlead portions for soldering.)

First, the relationship between the time of heating and the wetting characteristics of solder were tested. In this experiment, the samples of the ceramic packages were heated. Heating was carried out on a hot plate controlled at 450° C. in air at atmospheric pressure for zero, 3, 6, 12, 18, and 24 minutes. The flux which was used in order to improve the solder wetting characteristics was MIL-F-14256C (Type A), and for this purpose the package was dipped in the flux for 5 to 10 seconds. Then the package was dipped into solder for 5 seconds for each side of the package. The composition of the solder was Sn/Pb=6/4, and it was maintained at 230±5° C.

Figure 9:
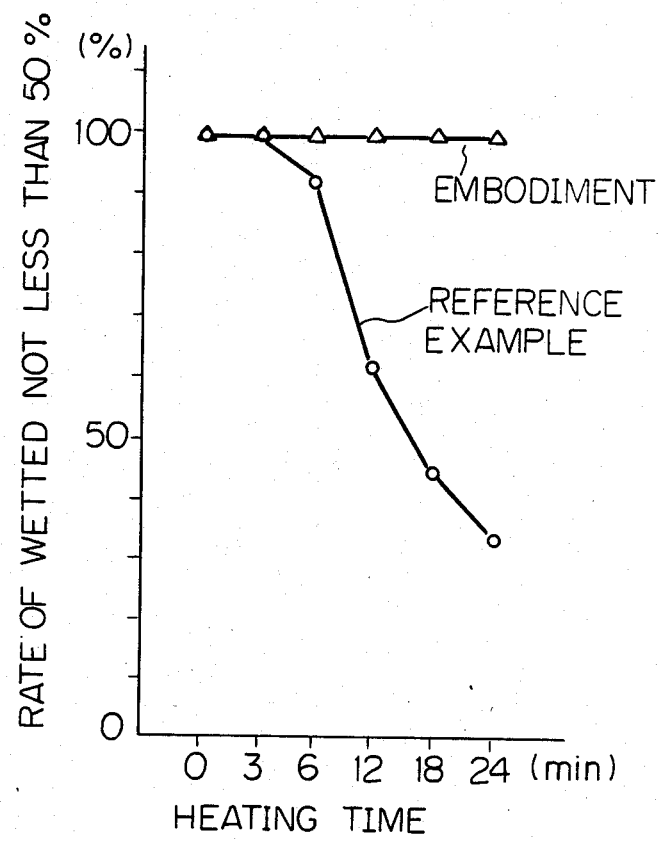
FIG. 9 is a diagram showing the ratio of the number of the outerlead grooves wetted not less than 50% to the total grooves with respect to heating time.
Figure 10:
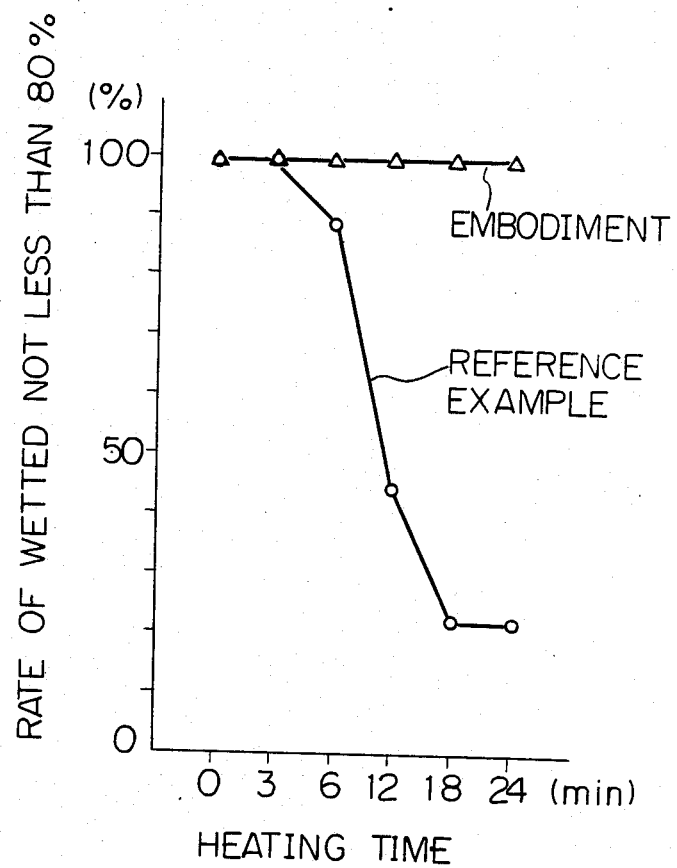
FIG. 10 is a diagram showing the ratio of the number of the outerlead grooves wetted not less than 80% to the total grooves with respect to heating time.
Figure 11:
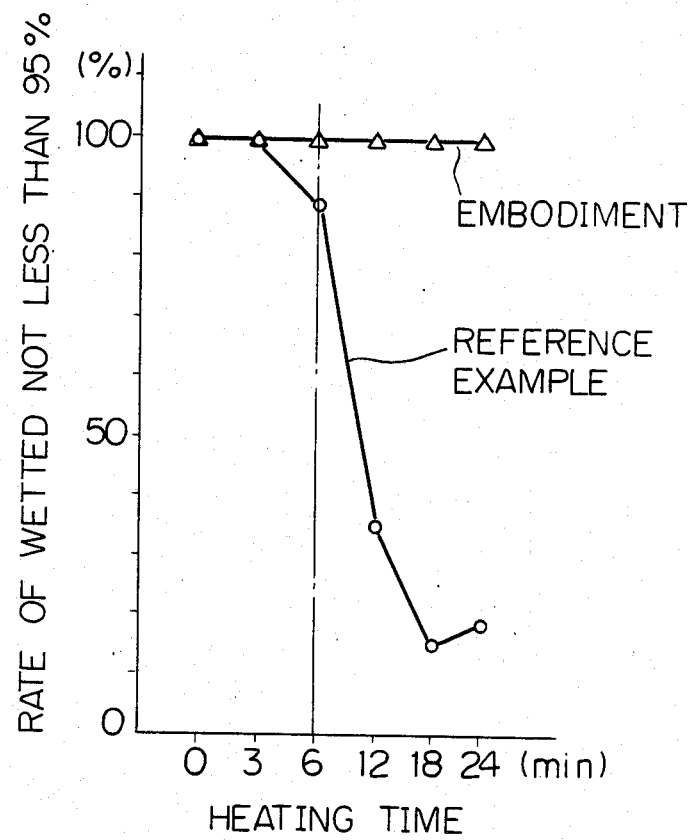
FIG. 11 is a diagram showing the ratio of the number of the outerlead grooves wetted not less than 95% to the total grooves with respect to heating time.

Under the above-mentioned conditions, the following results of solder wetting characteristics were obtained as represented in Table 1 and FIGS. 9, 10, and 11. In table 1 below, each numeral represents the percentage (%) of the number of outerlead grooves having a wet area which is smaller than the listed percentage of coverage with respect to the total of 80 outerlead grooves in four samples, each having 20 outerlead grooves. The graphs in FIGS. 9–11, on the other hand, depict the percentage of outerlead grooves not less than the percentage on each graph.

TABLE 1

| | WET AREA IN GROOVE | | | | | |
|---|---|---|---|---|---|---|
| | LESS THAN 50% | | LESS THAN 80% | | LESS THAN 95% | |
| T | B | A | B | A | B | A |
| 0 Min | 0% | 0% | 0% | 0% | 0% | 0% |
| 3 | 0 | 0 | 0 | 0 | 0 | 0 |
| 6 | 8 | 0 | 11 | 0 | 11 | 0 |
| 12 | 38 | 0 | 55 | 0 | 65 | 0 |
| 18 | 55 | 0 | 78 | 0 | 85 | 0 |
| 24 | 66 | 0 | 78 | 0 | 81 | 0 |

T: Time of Heating at 450° C. on the Hot Plate
A: Embodiment
B: Reference Example Second, the relationship between the heating temperature and the wetting characteristics of solder were tested. In this experiment, the samples of the ceramic packages were heated on a hot plate under the atmospheric conditions for a fixed 10 minutes, but the heating temperature, that is to say, the temperature of the hot plate was set at 400° C., 450° C., and 500° C. The compositions of the solder and the flux were the same as before.

Figure 12:
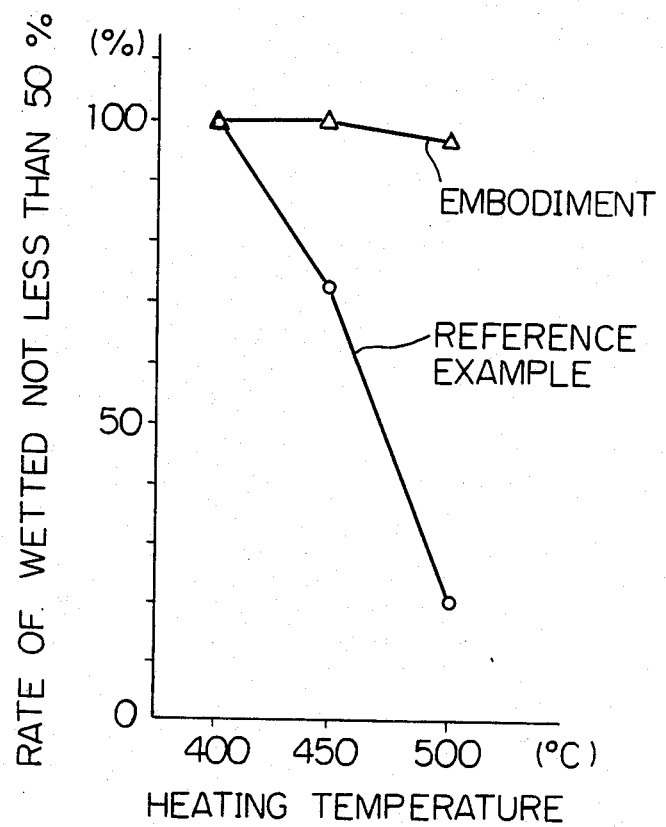
FIG. 12 is a diagram showing the ratio of the number of the outerlead grooves wetted not less than 50% to the total grooves with respect to heating temperature.
Figure 13:
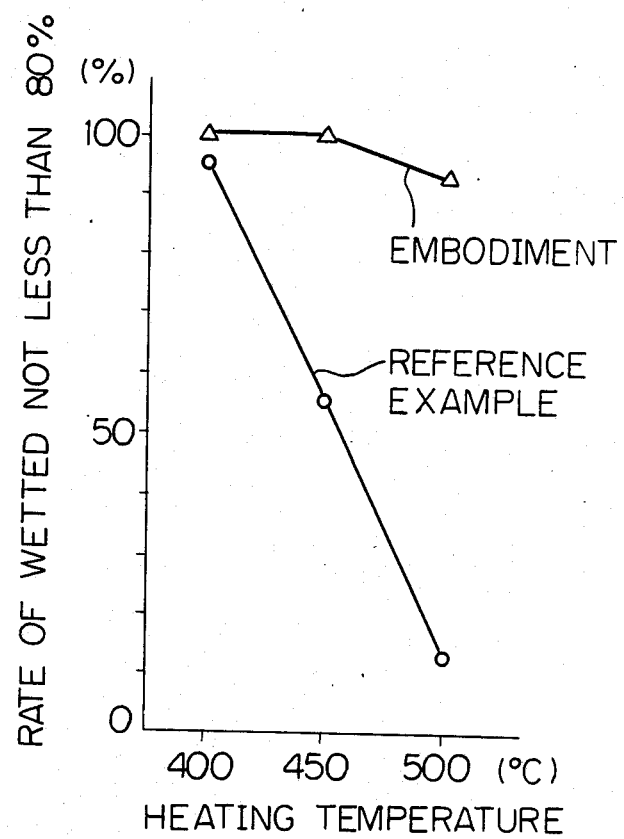
FIG. 13 is a diagram showing the ratio of the number of the outerlead grooves wetted not less than 80% to the total grooves with respect to heating temperature.
Figure 14:
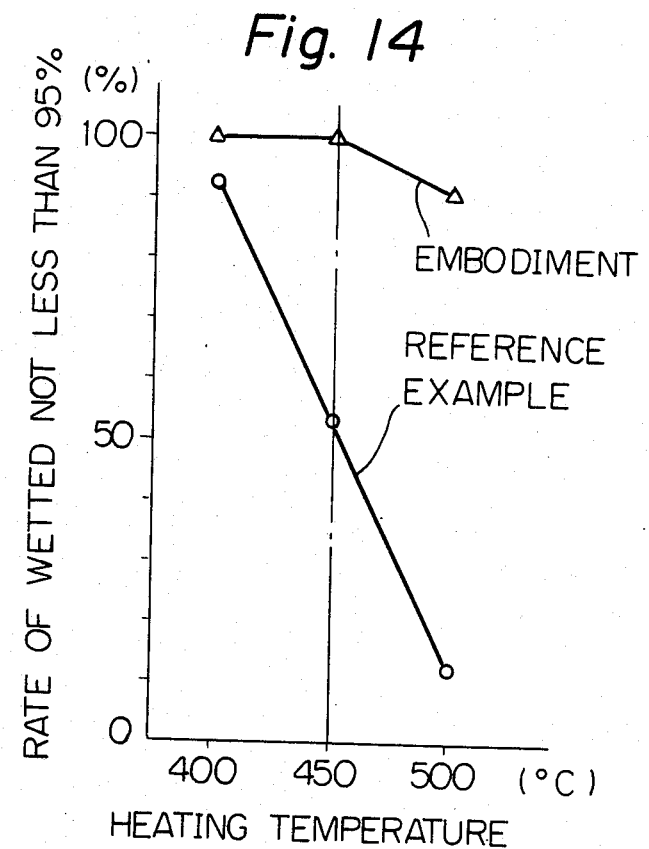
FIG. 14 is a diagram showing the ratio of the number of the outerlead grooves wetted not less than 95% to the total grooves with respect to heating temperature.

Under such conditions, the following results of the wetting characteristics of the solder were obtained as represented in Table 2 and FIGS. 12, 13, and 14. In table 2 below, each numeral represents, in the same manner as before, the percentage (%) of the number of the outerlead grooves having a wet area smaller than the listed percentage of coverage, with respect to the total of 80 outerlead grooves in four samples, each having 20 outerlead grooves. The graphs in FIGS. 12–14, on the other hand, depict the percentage of outerlead grooves not less than the percentage on each graph.

TABLE 2

| Temp. | WET AREA IN GROOVE | | | | | |
|---|---|---|---|---|---|---|
| | LESS THAN 50% | | LESS THAN 80% | | LESS THAN 95% | |
| | B | A | B | A | B | A |
| 400° C. | 0% | 0% | 5% | 0% | 9% | 0% |
| 450 | 28 | 0 | 45 | 0 | 46 | 0 |
| 500 | 80 | 3 | 88 | 8 | 88 | 9 |

Temp.: Temperature of Heating for 10 minutes on the Hot Plate
A: Embodiment
B: Reference Example Generally speaking, the solder wetting characteristic required for ceramic packages is such that it is not acceptable if there is one or more outerlead portion wherein the percentage of wet area is less than 95%. The embodiments of the present invention and the reference examples can be compared under the conditions of heating at 450° C. for 6 minutes (Table 1) and heating at 450° C. for 10 minutes (Table 2), which substantially conform to the conditions under which actual ceramic covers are heat-sealed by glass of low melting point, i.e., heat-sealed at 450° C. for 5 to 10 minutes. The samples of ceramic packages according to the present invention, i.e., Embodiments (A), which have a cobalt layer as an underlayer all have outerlead grooves with wet areas of not less than 95% and excellent solder characteristics. As a result, the percentage of acceptable packages is substantially 100%, as clearly seen from Tables 1 and 2 and FIGS. 11 and 14.

Contrary to this, the Reference Examples (B) which have a nickel layer as an underlayer have 11% outerlead grooves with wet areas of less than 95% when heated for six minutes, as clearly seen in Table 1 and FIG. 11. When heated for ten minutes, the reference examples (B) have 46% outerlead grooves with wet areas of less than 95%, as clearly seen in Table 2 and FIG. 14.

Figure 15:
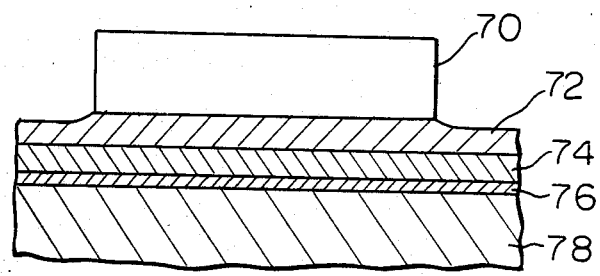
FIG. 15 is a schematic cross-sectional view of the die-bonding area of a package.

Other experimental results concerning the die-bonding process will now be explained with reference to Tables 3 and 4 below and FIG. 15. Generally speaking, the die-bonding process is carried out as follows. As seen in FIG. 15, a semiconductor die 70 is put on the surface of gold plated layer 72 which is heated to about 450° C. and the die 70 is simultaneously scrubbed, so that Au/Si eutectic alloy is formed between the back surface of the die 70 and the gold plate layer 72, and the die 70 is therefore attached to the die-bonding area 12. In FIG. 15, reference numeral 74 indicates an underlayer, i.e., a nickel or nickel-alloy layer in the reference examples, and a cobalt or cobalt-alloy layer in the embodiments; 76 a tungsten metalized layer; and 78 a ceramic base.

In this experiment, 16 samples (Nos. 1 to 16) were used and there were four samples of each kind, as shown in Table 3.

TABLE 3

| SAMPLE NO. | 1-ST PLT | 2-ND PLT | 2-ND PLT THICKNESS | SINTERING W OR W/O |
|---|---|---|---|---|
| Reference Example | | | | |
| 1 | Ni—B. 0.5 μm | — | — | W/O |
| 2 | Ni—B. 0.5 μm | — | — | W |
| 3 | Ni—B. 0.5 μm | E. Ni PLT | 1.5 | W/O |
| 4 | Ni—B. | " | " | W |
| 5 | Ni—B. 0.5 μm | " | 5.0 | W/O |
| 6 | Ni—B. 0.5 μm | " | " | W |
| 7 | Ni—B. 0.5 μm | " | 10.0 | W/O |
| 8 | Ni—B. 0.5 μm | " | " | W |
| Embodiment | | | | |
| 9 | Co—B 0.5 μm | — | — | W/O |
| 10 | Co—B 0.5 μm | — | — | W |
| 11 | Co—B 0.5 μm | E. Co PLT | 1.5 | W/O |
| 12 | Co—B 0.5 μm | " | " | W |
| 13 | Co—B 0.5 μm | " | 5.0 | W/O |
| 14 | Co—B 0.5 μm | " | " | W |
| 15 | Co—B 0.5 μm | " | 10.0 | W/O |
| 16 | Co—B 0.5 μm | " | " | W |

As seen in Table 3, an underlayer was formed on the two plating layers for most of the samples as follows:
(1) A first plating indicated as "1-ST PLT" is an underplate for brazing which in the case of the
  Reference Examples (Nos. 1 to 8) was composed of a nickel-boron (Ni-B) alloy of 0.5 μm thickness and in the
  Embodiments (Nos. 9 to 16) was composed of a cobalt-boron (Co-B) alloy of 0.5 μm thickness
(2) A second plating indicated as "2-ND PLT" is an underplate for gold plating which in the case of the
  Reference Examples (Nos. 1 to 8) was electrolytic nickel (E. Ni) plating with thicknesses of 1.5, 5.0 and 10.0 μm and in the
  Embodiments (Nos. 9 to 16) was electrolytic cobalt (E. Co) plating with thicknesses of 1.5, 5.0 and 10.0 μm
(3) After the second plating, some of the samples were sintered (a heat-treatment for Ni plating layer) at about 750° C. The symbol W/O indicates that the sample was not subjected to sintering, while W indicates that the sample was subjected to sintering.
(4) Then, all the samples were plated with gold till about 1.3 μm thick.

Using the above-mentioned 16 samples, including reference examples Nos. 1 to 8 and embodiments Nos. 9 to 16, die-bonding was carried out using the following process:
1. Baking at 300° C. in $N_2$.
2. Die-bonding with gold at 430° C. in $N_2$.
3. Wire-bonding
4. Frit sealing for 10 minutes at 480° C. in Air, a process for heat-sealng a ceramic cover using sealing glass of low melting point.
5. Aging for 30, 100, 150 200, 300 or 500 hours at 300° C. in Air After a semiconductor die 70 (FIG. 15) was mounted on the die-bonding area of the package for each sample, a test for peeling or shearing the die 70 was carried out for each sample. The results of the peeling test are shown in Table 4 below.

TABLE 4

| SAMPLE NO. | | Time of Aging | | | | | |
|---|---|---|---|---|---|---|---|
| | | 30 H | 100 H | 150 H | 200 H | 300 H | 500 H |
| Reference Example 1 | Ni—B | 0/4 | 0/4 | 0/4 | 0/4 | 0/4 | 0/4 |
| Reference Example 2 | Ni—B SINTER | 0/4 | 0/4 | 0/4 | 0/4 | 0/4 | 0/4 |
| Reference Example 3 | E.Ni 1.5μ | 0/4 | 2/4 | 0/4 | 0/4 | 1/4 | 2/4 (1/4) |
| Reference Example 4 | E.Ni SINTER | 0/4 | 0/4 | 0/4 | 0/4 | 0/4 | 0/4 |
| Reference Example 5 | E.Ni 5.0μ | 1/4 | 0/4 | 0/4 | 2/4 (2/4) | 4/4 (4/4) | 4/4 (4/4) |
| Reference Example 6 | E.Ni SINTER | 0/4 | 0/4 | 0/4 | 0/4 | 0/4 | 4/4 (4/4) |
| Reference Example 7 | E.Ni 10.0μ | 0/4 | 0/4 | 2/4 | 3/4 (2/4) | 4/4 (4/4) | 4/4 (4/4) |
| Reference Example 8 | E.Ni SINTER | 0/4 | 0/4 | 1/4 | 0/4 | 0/4 | 1/4 |
| Embodiment 9 | Co—B | 0/4 | 0/4 | 0/4 | 0/4 | 0/4 | 0/4 |
| Embodiment 10 | Co—B SINTER | 0/4 | 0/4 | 0/4 | 0/4 | 0/4 | 0/4 |
| Embodiment 11 | E.Co 1.5μ | 0/4 | 0/4 | 0/4 | 0/4 | 0/4 | 0/4 |
| Embodiment 12 | E.Co SINTER | 0/4 | 0/4 | 0/4 | 0/4 | 0/4 | 0/4 |
| Embodiment 13 | E.Co 5.0μ | 0/4 | 0/4 | 0/4 | 0/4 | 0/4 | 0/4 |
| Embodiment 14 | E.Co SINTER | 0/4 | 0/4 | 0/4 | 0/4 | 0/4 | 0/4 |
| Embodiment 15 | E.Co 10.0μ | 0/4 | 0/4 | 0/4 | 0/4 | 0/4 | 0/4 |
| Embodiment 16 | E.Co SINTER | 0/4 | 0/4 | 0/4 | 0/4 | 0/4 | 0/4 |

In Table 4, the number of samples among four whose dies 70 were at least partially peeled is indicated. Parentheses indicate the number of samples among four whose dies 70 were entirely peeled. As shown in Table 4, if the nickel underlayer 74 was thick and the sample had not been sintered, the die 70 was easily peeled in the case of reference examples. However, for the embodiments, there are no samples whose dies 70 were peeled, regardless of whether there was sintering or the thickness of the cobalt underlayer 74.

As described hereinbefore, according to the present invention, a ceramic package for semiconductor devices which has a good solderability, durability, reliability and high productivity, and is relatively heatproof, can be obtained by adopting a cobalt plated underlayer for the gold plating.

It is to be understood that this invention is not limited in its application to the details of the embodiments described hereinbefore and illustrated in the drawings, but is capable of many changes and modifications without departing from the sprit and scope of the claimed invention, since equivalent effects can also be attained when applying this invention to other packages, such as hermetic seal headers, lead frames, and etc.

We claim:

1. A ceramic package for enclosing semiconductor devices on a semiconductor die, said ceramic package comprising:
   a ceramic base; and
   a die-bonding area, formed on said ceramic base, for mounting thereon the semiconductor die, said die-bonding area comprising:
      an electrically conducting metallized layer formed on said ceramic base;
      an underlayer, formed from one of cobalt and a cobalt alloy substantially excluding nickel, plated on said electrically conducting metallized layer; and
   a gold-plated layer formed on at least a part of said underlayer.

2. A ceramic package as set forth in claim 1, wherein said ceramic package is sealed using glass having a low melting point.

3. A ceramic package as set forth in claim 1, wherein said underlayer consisits essentially of cobalt.

4. A ceramic package as set forth in claim 1, wherein said underlayer is formed from an alloy consisting essentially of cobalt and boron.

5. A ceramic package, operatively connectable to an external device, for enclosing semiconductor devices on a semiconductor die, said ceramic package comprising:
   a ceramic base; and
   a plurality of outerlead portions, formed on said ceramic base, operatively connectable to the external device, each of the outerlead portions comprising:
      one of an electrically conducting metal and metallized portion on said ceramic base; and
      a plated layer, formed from one of cobalt and a cobalt alloy substantially excluding nickel, formed on said one of electrically conducting metal and metallized portion.

6. A ceramic package as set forth in claim 5, further comprising gold-plated layers formed on the plated layers of said outerlead portions.

7. A ceramic package as set forth in claim 3, wherein sid plated layer consists essentially of cobalt.

8. A ceramic package as set forth in claim 3, wherein said plated layer is formed from an alloy consisting essentially of cobalt and boron.

9. A chip carrier type ceramic package, opertively connectable to an external device, for enclosing semiconductor devices on a semiconductor die, said package comprising:
   a ceramic base having a periphery;
   a gold-plated die-bonding area, formed on said ceramic base, for mounting thereon the semiconductor die, having an underlayer formed from one of cobalt and a cobalt alloy substantially excluding nickel;
   a gold-plated wire-bonding area formed on said ceramic base, having an underlayer formed from one of cobalt and the cobalt alloy substantially excluding nickel; and
   a plurality of gold-plated outerlead grooves, formed on the periphery of said ceramic base and operatively connectable to the external device, each of said outerlead grooves comprising:

an electrically conducting metallized layer formed on said ceramic base;

an underlayer, formed from one of cobalt and the cobalt alloy substantially excluding nickel, formed on said electrically conducting metallized layer; and a gold layer formed on said underlayer.

10. A chip carrier type ceramic package as set forth in claim 5, wherein the underlayer in said gold-plated die-bonding area consists essentially of cobalt.

11. A chip carrier type ceramic package as set forth in claim 5, wherein the underlayer in said gold-plated die-bonding area is formed from an alloy consisting essentially of cobalt and boron.

12. A pin grid array type ceramic package, operatively connectable to an external device, for enclosing semiconductor devices on a semiconductor die, said package comprising:

a ceramic base having faces;

a gold-plated die-bonding area, formed on said ceramic base for mounting thereon the semiconductor die, said die-bonding area having an underlayer comprising one of cobalt and a cobalt alloy substantially excluding nickel;

a gold-plated wire-bonding area, formed on said ceramic base, having an underlayer comprising one of cobalt and the cobalt alloy substantially excluding nickel; and a plurality of outerlead pins, arranged in a grid on one of the faces of said ceramic base, operatively connectable to the external device, each of said outerlead pins comprising:

an electrically conducting metal on one of the faces of said ceramic base; and a plated layer, formed from one of cobalt and the cobalt alloy substantially excluding nickel, formed on said electrically conducting metal.

13. A pin grid array type ceramic package as set forth in claim 12, further comprising gold-plated layers formed on the layers of said outerlead pins.

14. A chip carrier type ceramic package as set forth in claim 9, wherein said ceramic package is sealed using glass having a low melting point.

15. A chip carrier type ceramic package as set forth in claim 9, wherein gold is simultaneously plated on the underlayer of said gold-plated die-bonding area and on the underlayer of each of said gold-plated outerlead grooves.

16. A pin grid array type ceramic package as set forth in claim 6, wherein the underlayer in the gold-plated die-bonding area consists essentially of cobalt.

17. A pin grid array type ceramic package as set forth in claim 6, wherein the underlayer in said gold-plated die-bonding area is formed from an alloy consisting essentially of cobalt and boron.

* * * * *

UNITED STATES PATENT AND TRADEMARK OFFICE
CERTIFICATE OF CORRECTION

PATENT NO. :     4,675,243

DATED      :     June 23, 1987

INVENTOR(S) :    OBINATA ET AL.

It is certified that error appears in the above-identified patent and that said Letters Patent is hereby corrected as shown below:

Col. 5, line 33, "cover" should be --cover 42--.

Col. 10, line 49, "sid" should be --said--.

Signed and Sealed this

Twenty-ninth Day of December, 1987

Attest:

DONALD J. QUIGG

Attesting Officer

Commissioner of Patents and Trademarks